United States Patent [19]

Masuda

[11] Patent Number: 4,644,291
[45] Date of Patent: Feb. 17, 1987

[54] OPERATIONAL AMPLIFIER
[75] Inventor: Shinji Masuda, Tokyo, Japan
[73] Assignee: NEC Corporation, Tokyo, Japan
[21] Appl. No.: 632,231
[22] Filed: Jul. 19, 1984
[30] Foreign Application Priority Data
   Nov. 8, 1983 [JP]  Japan ............................ 58-209302
[51] Int. Cl.[4] .............................................. H03F 3/45
[52] U.S. Cl. ............................... 330/261; 330/253; 330/255
[58] Field of Search .............. 330/252, 253, 255, 257, 330/261, 277, 288

[56] References Cited
   FOREIGN PATENT DOCUMENTS
   183108  11/1982  Japan .................................. 330/257

OTHER PUBLICATIONS
"High Voltage Gain CMOS OTA for Micropower SC Filters", vol. 17, No. 4, 19th Feb. 1981, pp. 160–162, Electronics Letters.

Primary Examiner—Gene Wan
Attorney, Agent, or Firm—Burns, Doane, Swecker & Mathis

[57] ABSTRACT

An operational amplifier has a bias stage, a sampled differential stage, and a push-pull cascode stage. Unlike the conventional operational amplifier, the sampled differential stage is adopted in place of a differential stage has switches and capacitors. An input signal is transferred to the push-pull cascode stage through the capacitors in cooperation with the switches operated in response to clock signals phase-shifted by 180°, thereby applying optimal bias voltages to the push-pull cascode stage and providing a wide frequency bandwidth.

9 Claims, 7 Drawing Figures

OPERATIONAL AMPLIFIER

BACKGROUND OF THE INVENTION

The present invention relates to an operational amplifier.

A capacitor is often connected to an output terminal of an operational amplifier in an MOS analog circuit such as a switched capacitor filter and a charge-equilibrium A/D converter. An operational transconductance amplifier (OTA) is described in detail, for example in "HIGH VOLTAGE GAIN CMOS OTA FOR MICROPOWER SC FILTERS", Vol. 17, No. 4, 19th Feb. 1981, PP. 160–162, ELECTRONICS LETTERS and serves as a low-power consumption circuit which is capable of providing a high voltage gain and a wide frequency bandwidth for a capacitive load and which does not require a phase compensating capacitor.

Recently, the frequency of signals processed by MOS analog circuits increases more and more and the OTA as above is unsatisfactory for signals of frequencies up to the order of $10^6$ to $10^8$ $H_z$.

Therefore, the advent of an operational amplifier has been desired which has a high voltage gain and low power consumption for such high frequency signals.

SUMMARY OF THE INVENTION

It is an object of the present invention to provide an operational amplifier wherein a sampled differential input circuit is used in place of a conventional differential amplification stage so as to widen the frequency bandwidth.

Another object of this invention is to provide an operational amplifier of the sampled differential input circuit type which is capable of amplifying operation over the entire clock signal period.

According to the present invention, there are provided two capacitors and four switches so as to obtain a single-phase amplification stage. It should be noted that four capacitors and eight switches are required to obtain amplification in both phases. In the single-phase sampled differential amplification stage, an inverting input terminal of the operational amplifier is coupled, in response to one of the clocks which are 180°-phase shifted, to the gate of a p-channel transistor connected in a cascode manner in an output amplification stage, through a first capacitor charged to a potential corresponding to a difference between a potential at a non-inverting input terminal and a first predetermined gate bias voltage of the p-channel transistor, and the inverting input terminal is coupled, in response to the same clock, to the gate of an n-channel transistor connected in a cascode manner in the output amplification stage, through a second capacitor charged to a potential corresponding to a difference between a potential at the non-inverting input terminal and a second predetermined gate bias voltage of the n-channel transistor, thereby applying an optimal bias voltage to the output amplification stage and effectively transferring an input signal to the output amplification stage.

According to an aspect of the present invention, there is provided an operational amplifier having: M (M is an integer of 2 or more) cascode n-channel transistors, M cascode p-channel transistors, the M p- and n-channel transistors being connected in series with each other between positive and negative power supply lines so as to constitute a push-pull cascode stage (output amplification stage) including a single complementary pair; capacitors for supplying an input signal to the push-pull cascode stage while the capacitors respectively shift potentials by a predetermined DC voltage; and switches which are selectively, periodically turned on/off in response to clock signals, wherein an inverting input terminal of the operational amplifier is connected to a common node (N3) through a first switch of the switches, an non-inverting input terminal thereof is connected to the common node (N3) through a second switch, the common node (N3) is also connected to a gate of first p-channel transistor of the M cascode p-channel transistors through a first capacitor of the capacitors and to a gate of a first n-channel transistor of the M cascode n-channel transistors through a second capacitor, the gate of the first p-channel transistor is connected to a first predetermined voltage through a third switch, and the gate of the first n-channel transistor is connected to a second predetermined voltage through a fourth switch.

DETAILED DESCRIPTION OF THE PREFERRED EMBODIMENTS

Figure 1:
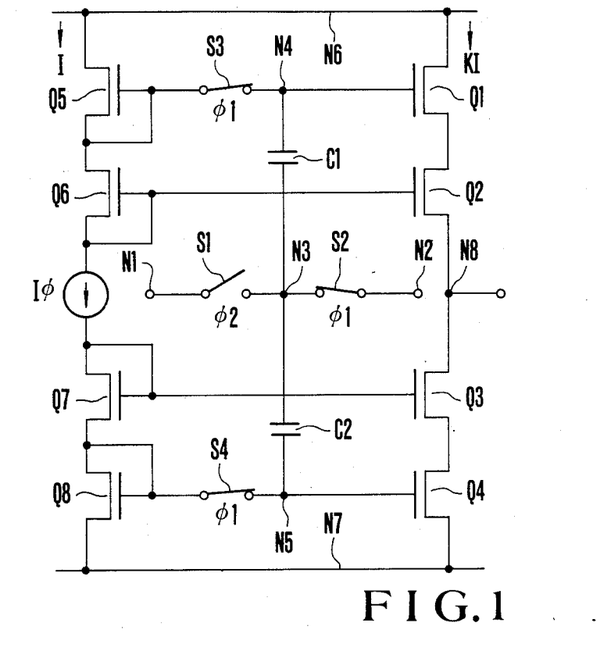
FIG. 1 is a circuit diagram showing the basic configuration of an operational amplifier for single-phase operation according to a first embodiment of the present invention.

FIG. 1 shows an operational amplifier for single-phase operation according to a first embodiment of the present invention.

Referring to FIG. 1, reference symbols Q1, Q2, Q5 and Q6 denote p-channel MOSFETs, respectively; Q3, Q4, Q7 and Q8, n-channel MOSFETs, respectively; C1 and C2, capacitors, respectively; and S1, S2, S3 and S4, switches each of which comprises a p- or n-channel MOSFET, or p-and n-channel MOSFETs. Reference symbol I$\phi$ denotes a constant current source. These elements are formed as an IC in accordance with bulk CMOS manufacturing techniques or silicon-on-sapphire CMOS manufacturing techniques.

The MOSFETs Q1, Q2, Q3 and Q4 constitute a CMOS output amplification stage or a push-pull cascode stage. The MOSFETs Q5, Q6, Q7 and Q8 constitute a bias stage for applying predetermined bias voltages to the CMOS output stage. The source of the MOSFET Q1 is connected to a positive power supply line N6. The drain of the MOSFET Q1 is connected to the source of the MOSFET Q2. The drains of the MOS- FETs Q2 ans Q3 are connected to an output terminal N8. The source of the MOSFET Q3 is connected to the drain of the MOSFET Q4. The source of the MOSFET Q24 is connected to a negative power supply line N7. The source of the MOSFET Q5 is also connected to the positive power supply line N6. The gate and drain of the MOSFET Q5 are commonly connected to the source of the MOSFET Q6. The gate and drain of the MOSFET Q6 are commonly connected to one end of the constant current source I$\phi$, and the source of the MOSFET Q8 is connected to the negative power supply line N7. The gate and drain of the MOSFET Q8 are commonly connected to the source of the MOSFET Q7. The gate and drain of the MOSFET Q7 are connected to the other end of the constant current source I$\phi$. The gate of the MOSFET Q5 is connected to a node N4 through the switch S3. The gate of the MOSFET Q1 is connected to the node N4. The gate of the MOSFET Q8 is connected to a node N5 through the switch S4. The gate of the MOSFET Q4 is connected to the node N5. The node N4 is connected to a node N3 through the capacitor C1 and the node N3 is connected to the node N5 through the capacitor C2. An inverting input terminal N1 is connected to the node N3 through the switch S1. A non-inverting input terminal N2 is connected to the node N3 through the switch S2.

Figure 2:
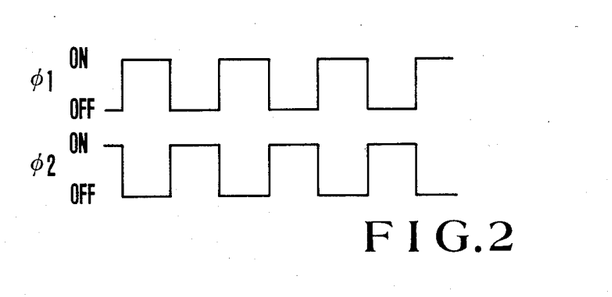
FIG. 2 shows waveforms of 180°-phase shifted clock signals applied to switches of the operational amplifier shown in FIG. 1.

The MOSFETS Q5 and Q1, Q6 and Q2, Q7 and Q3, and Q8 and Q4 have a channel width ratio of 1: K, respectively, K being larger than 1 (one), other parameters of these pairs are the same. The constant current source I$\phi$ generates a constant DC current I. Referring to FIG. 1, the switches S2, S3 and S4 are turned on in response to a clock signal $\phi$1, and the switch S1 is turned on in response to a clock signal $\phi$2. The clock signals $\phi$1 and $\phi$2 have a 50% duty cycle and are phase-shifted by 180°. Accordingly a group of switches S2, S3 and S4 and the switch S1 are turned on alternately. FIG. 2 shows waveforms of the clock signals $\phi$1 and $\phi$2.

The operation of the operational amplifier shown in FIG. 1 will now be described. Assume that the non-inverting input terminal N2 is connected to a given constant voltage including ground potential and is set at a given potential, and that an input signal is applied to the inverting input terminal N1.

While the clock signal $\phi$1 is enabled and the clock signal $\phi$2 is disabled, the MOSFETs Q5, Q6, Q7 and Q8 and the MOSFETs Q1, Q2, Q3 and Q4 constitute a current mirror network. A current I flows through the MOSFETs Q5, Q6, Q7 and Q8, and a current KI flows through the MOSFETs Q1, Q2, Q3 and Q4. The potential difference between the MOSFETs Q5 and Q6 in the bias circuit is the same as that between the MOSFETs Q7 and Q8 also therein. At the same time, the potential difference between the MOSFETs Q1 and Q2 in the output circuit is the same as that between the MOSFETs Q3 and Q4. Therefore, the node N8 is set at a potential V(N8) as an intermediate value between a potential +VDD at the positive power supply line N6 and a potential −VDD at the negative power supply line N7. In this case, the capacitor C1 is charged to a potential {V(N2)−V(N4)} corresponding to the difference between a first predetermined potential at the gate of the MOSFET Q5, that is, a potential V(N4) at the node N4 upon closure of the switch S3 and the potential V(N2) at the non-inverting input terminal N2 through S3, N4, C1, N3 and S2. Similarly, the capacitor C2 is charged to a potential {V(N2)−V(N5)} corresponding to the difference between the potential V(N2) at the non-inverting input terminal N2 and the potential V(N5) at the node N5.

However, when the clock signal $\phi$1 is disabled and the clock signal $\phi$2 is enabled, the capacitors C1 and C2 hold the charges and hence the potential V(N1) at the inverting input terminal N1 is shifted by the capacitors C1 and C2 serving as voltage shifters. As a result, a voltage V*(N4) at the node N4 becomes V(N1)−{V(N2)−V(N4)}, and a voltage V*(N5) at the node N5 becomes V(N1)−{V(V2)−V(N5)}. A change V(N1)−V(N2) in voltage at each of the nodes N4 and N5 is amplified by the MOSFETs Q1, Q2, Q3 and Q4 in the output stage. As a result, an amplified voltage finally appears at the output terminal N8.

Figure 3:
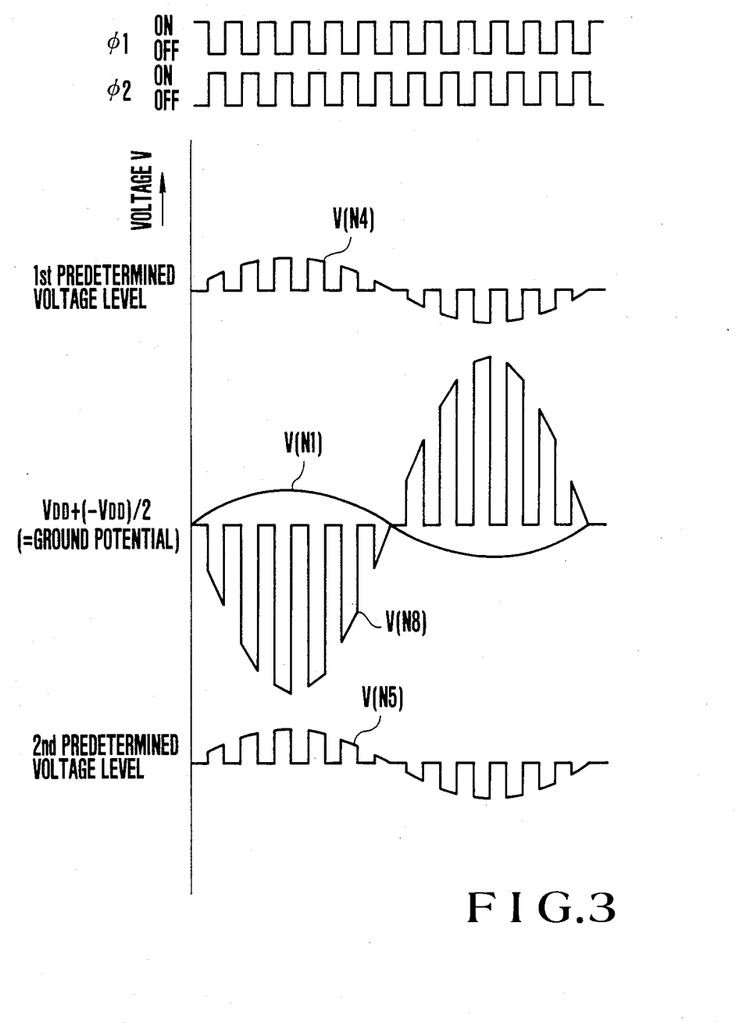
FIG. 3 shows waveforms of the signals in order to explain the operation of the operational amplifier shown in FIG. 1.

The clock signals $\phi$1 and $\phi$2 are alternately switched for a short period during which the charge voltages at the capacitors C1 and C2 will not change due to leakage currents through the switches. FIG. 3 shows the case wherein the non-inverting input terminal N2 of the operational amplifier shown in FIG. 1 is grounded, and the potential V(N1) at the inverting input terminal N1 is voltage shifted to the nodes N4 and N5 and is applied to the gates of the MOSFETs Q1 and Q4, thereby performing amplification.

Figure 4:
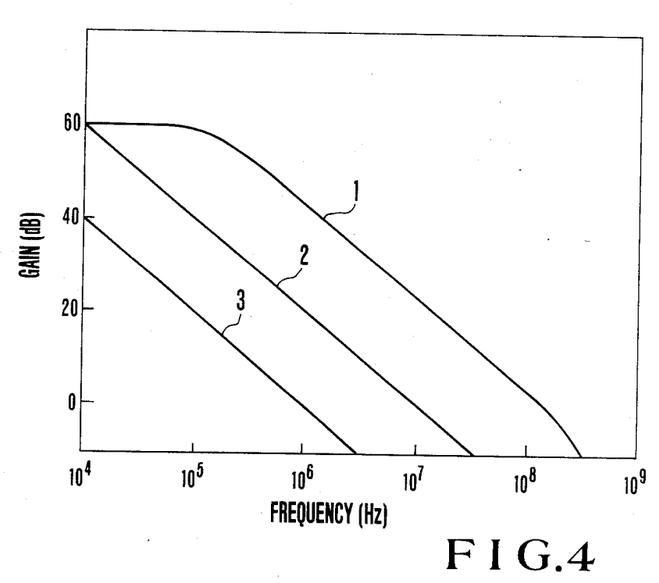
FIG. 4 is a graph showing a characteristic of the FIG. 1 operational amplifier comparative to that of conventional OTAs.

FIG. 4 graphically illustrates a frequency response characteristic of the operational amplifier according to FIG. 1, showing curve 1 corresponding to the FIG. 1 amplifier comparative to curves 2 and 3 corresponding to the conventional OTA described previously. Especially, the previously described paper is suggestive of curve 3, and an OTA described in this paper but manufactured by a modern fabrication process effective to reduce stray capacitance can exhibit curve 2. Clearly, the curve 1 characteristic improves upon the characteristics of curves 2 and 3. Such an improvement seems mainly due to an reduced time constant of the sampled differential operational amplifier a compared to the conventional input differential stage. In addition, power loss of the sampled differential stage consisting of the capacitors and switches can be neglected when the capacitances of the capacitors C1 and C2 are much greater than gate capacitances of the MOSFERs Q1 and Q4, thereby reducing power consumption of the entire amplifier. Further, only one amplification stage is used, so that the zero-crossing frequency (frequency for a gain of unity) can be improved (See FIG. 4). An input offset voltage in this embodiment is generated due to non-matching between transistor parameters of the MOSFETs Q5 and Q1, Q6 and Q2, Q7 and Q3, and Q8 and Q4. However, this offset voltage can be reduced to be less than several millivolts in accordance with normal patterning and manufacturing precision.

As is apparent from FIG. 3, amplification is intermittently performed in a 50% duty cycle. In other words, in this circuit, the amplification operation is performed only during the clock $\phi$2. Amplification during periods of both the clock $\phi$1 and the clock $\phi$2 can be performed with an arrangement wherein two of the FIG. 1 sampled differential stages are connected in parallel. Such an arrangement wherein the amplification of an operational amplifier for the entire clock signal period can be effected is demanded in an application, particularly, to the switched capacitor filter mentioned previously and will be described as a second embodiment of the present invention with reference to FIG. 5.

Figure 5:
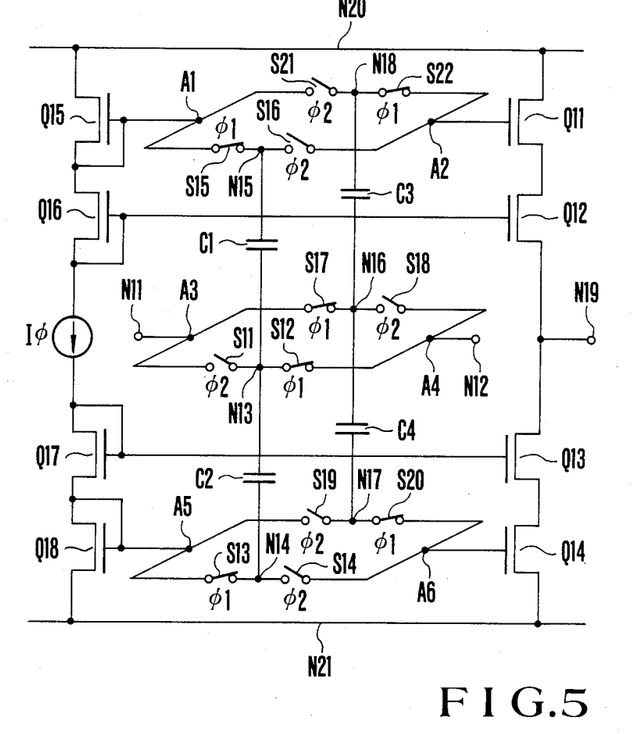
FIG. 5 is a circuit diagram of a sampled differential push-pull cascode operational amplifier for operation in both phases according to a second embodiment of the present invention.

According to the second embodiment, two capacitors and switches are added, and the additional capacitors and capacitors in the first embodiement are switched alternately every half a cycle.

FIG. 5 is a circuit diagram of a sampled differential push-pull cascode operational amplifier for both-phase operation. A switch S15 corresponding to the switch S3 of FIG. 1 is connected to the gate of MOSFET Q15 through a node A1. In this embodiment, a MOSFET switch S16 is added between nodes N15 and A2. The node A2 is connected to the gate of a MOSFET Q11. The node N15 between the switches S15 and S16 is connected to one end of a capacitor C1. The other end of the capacitor C1 is connected to a common node N13 between a pair of switches S11 and S12 which respectively correspond to the switches S1 and S2 of FIG. 1. The switch S11 is connected to an inverting input terminal N11 through a node A3. The switch S12 is connected to a non-inverting input terminal N12 through a node A4. The common node N13 is connected to one end of a capacitor C2. The other end of the capacitor C2 is connected to a node N14. A switch S13 is connected between the node N14 and a node A5, and the node A5 is connected to the gate of a MOSFET Q18. The switch S13 corresponds to the switch S4 of FIG. 1. A switch S14 is connected to the gate of MOSFET Q14 through a node A6. The switches S11, S12, S13, S14, S15 and S16 and the capacitors C1 and C2 constitute a first sampled differential stage.

Similarly, a switch S21 is connected to the gate of the MOSFET Q15 through the node A1. The switch S21 corresponds to the switch 3 of FIG. 1. A switch S22 is added between a node N18 and the node A2. The node N18 between the switches S21 and S22 is connected to one end of a capacitor C3. The other end of the capacitor C3 is connected to a node N16 between a pair of switches S17 and S18 which respectively correspond to the switches S1 and S2 of FIG. 1. The switches S17 and S18 are connected to the inverting and non-inverting input terminals N11 and N12 through the node A3 and a node A4, respectively. The node N16 is connected to one end of a capacitor C4. The other end of the capacitor C4 is connected to a common node N17 between switches S19 and S20. The switch S19 corresponds to the switch S4 of FIG. 1. The switch S20 is added between the common node N17 and the node A6. There are also seen in FIG. 5 MOSFETs Q12, Q13, Q16 and Q17, a constant current source Iφ, an output terminal N19 and power supply lines N20 and N21 which are connected in a similar manner to FIG. 1.

Figure 6:
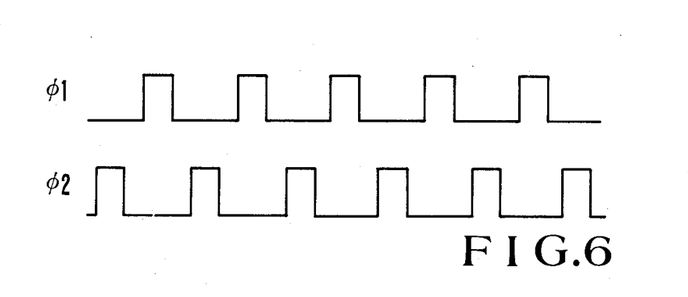
FIG. 6 shows clock signals applied to switches of the operational amplifier shown in FIG. 5.

The switches S12, S13, S15, S17, S20 and S22 are on-off controlled according to a clock signal $\phi 1$. The switches S11, S14, S16, S18, S19 and S21 are on-off controlled according to a clock signal $\phi 2$. The clock signal $\phi 1$ and $\phi 2$ are rectangular waves which never overlap each other, as shown in FIG. 6.

The operation of the embodiment of FIG. 5 will now be described. It is assumed that the non-inverting input terminal N12 is connected to ground at a potential substantially midway between the potential on the positive source terminal N20 and the potential on the negative source line N21.

During the period, during which the clock signal $\phi 1$ is "on", in the first differential circuit the capacitor C1 is charged by a suitable bias voltage generated between the drain of the transistor Q15 and non-inverting input terminal N12 through the switches S15 an S12, while the capacitor C2 is charged by a suitable bias voltage generated between the drain of the transistor Q18 and non-inverting input terminal N12 through the switches S13 and S12. Meanwhile, in the second differential circuit the input voltage applied to the inverting input terminal N11 is led to the gate of the transistor Q11 through the switch S17, capacitor C3, which is charged by the suitable bias voltage, and switch S22, and is also led to the gate of the transistor Q14 through the switch S17, capacitor C4, which is charged by the suitable bias voltage, and switch S20. The input voltage led to the gates of the transistors Q11 and Q14 is amplified by the output amplifier stage, and the amplified voltage is led to the output terminal N19.

During the period, during which the clock signal $\phi 2$ is "on", in the first differential circuit the input voltage applied to the inverting input terminal N11 is led to the gate of the transistor Q11 through the switch S11, capacitor C1, which is charged by the suitable bias voltage, and switch S16, and is also led to the gate of the transistor Q14 through the switch S11, capacitor C2, which is charged by the suitable bias voltage, and switch S14.

Meanwhile, in the second differential circuit the capacitor C3 is charged by a suitable bias voltage generated between the drain of the transistor Q15 and non-inverting input terminal N12 through the switches S21 and S18, while the capacitor C4 is charged by a suitable bias voltage generated between the drain of the transistor Q18 and non-inverting input terminal N12 through the switches S19 and S18. Like the case when the clock signal $\phi 1$ is "on", the input voltage led to the gates of the transistors Q11 and Q14 is amplified by the output amplifier stage, and the amplified voltage is delivered to the output terminal N19.

Figure 7:
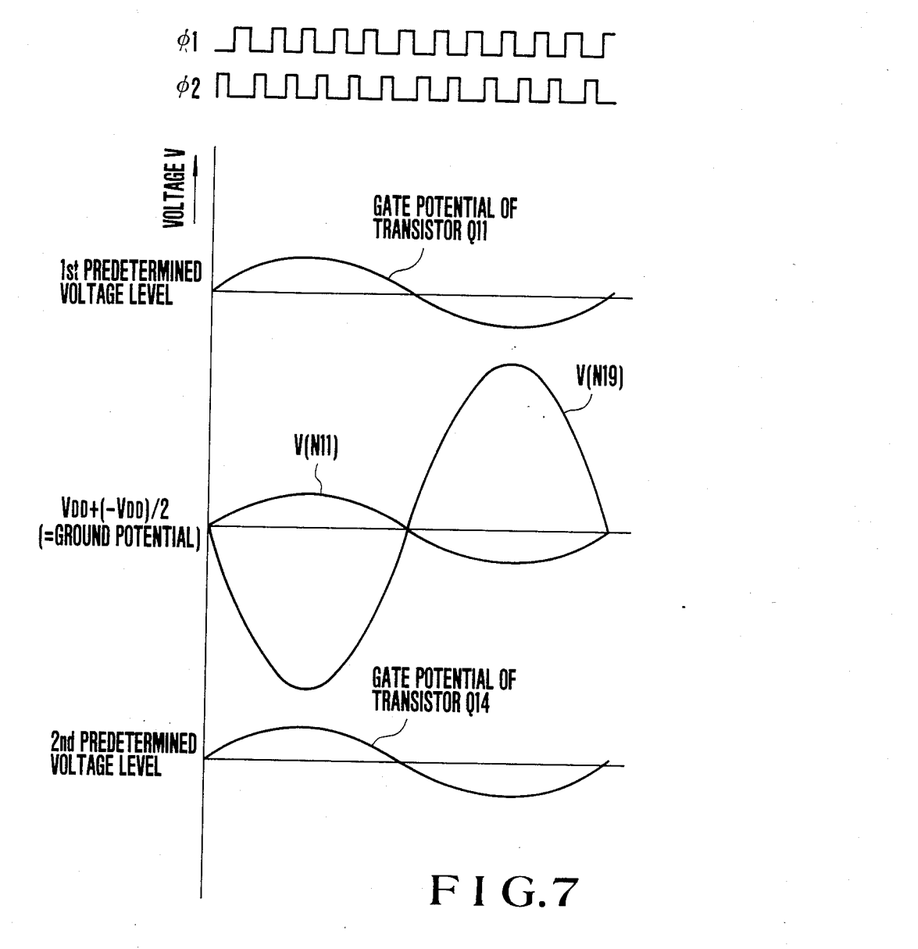
FIG. 7 shows waveforms of signals useful in explaining the operation of the operational amplifier shown in FIG. 5.

FIG. 7 is a view showing the potentials on the individual terminals in the embodiment shown in FIG. 5 when a sinusoidal wave is inputted to the inverting input terminal N11. In FIG. 7 V(N11) is the potential at the inverting input terminal N11, and V(N19) is the potential on the output terminal N19. The input voltage applied to the inverting input terminal N11 is supplied to the output amplifier stage through the second differential circuit while the clock signal $\phi 1$ is "on" and through the first differential circuit while the clock signal $\phi 2$ is "on". The operational amplifier according to the this embodiment is thus capable of amplifying operation over the entire period.

What is claimed is:
1. An operational amplifier, comprising:
bias circuit means connected between positive and negative power supply lines for supplying bias voltages;
differential circuit means having a sampled input and connected with said bias circuit means, and including an inverting input terminal for receiving an input signal and a non-inverting input terminal set at a predetermined potential level, said differential circuit means selectively sampling the signal on said inverting input terminal and the potential level at said non-inverting input terminal, and operable in response to said bias voltages from said bias circuit means, said input signal and said predetermined potential level to generate output control voltages; and
output circuit means having an output terminal and connected between said positive and negative power supply lines, said output circuit means operable as a cascode push-pull stage and responsive to said bias voltages from the bias circuit means and said output control voltages from the differential circuit means thereby to provide an amplified signal representative of said input signal on said inverting input terminal, said amplified signal appearing on said output terminal.

2. An amplifier according to claim 1, wherein said bias circuit means comprises: a first set of at least two metal oxide semiconductor field effect transistors of one type which are connected such that a first transistor has a source connected to said positive power supply line, a drain connected to a gate thereof and to a source of a second transistor whose gate and drain are commonly connected; a second set of at least two metal oxide semiconductor field effect transistors of the other type which are connected such that a first transistor has a source connected to said negative power supply line, and a drain connected to gate thereof and to a source of a second transistor whose gate and drain are commonly connected; and a constant current source which is inserted between said first set and said second set.

3. An amplifier according to claim 2, wherein said sampled differential means comprises: switching means connected to the gates of said first transistor of said first set and said first transistor of said second set and selectively switched in response to first and second clock signals which are phase-shifted by 180°, and capacitive means connected to said inverting and non-inverting input terminals and to the gates of said first transistor of said first set and said first transistor of said second set through said switching means.

4. An amplifier according to claim 3, wherein said switching means comprises a first switch connected to said inverting input terminal and operated in response to the second clock signal, a second switch connected to said non-inverting input terminal and to said inverting input terminal through said first switch and operated in response to said first clock signal, a third switch connected to the gate on said first transistor of said first set and operated in response to the first clock signal, and a fourth switch connected to the gate of said first transistor of said second set and operated in response to the first clock signal; and said capacitive means comprises a first capacitor, connected between said third switch and a common node between said first and second switches, for supplying the optimal bias voltage to said output circuit means during the second clock signal, and second capacitor, connected to said first capacitor and said fourth switch, for supplying the optimal bias voltage to said output circuit means.

5. An apparatus according to claim 4, wherein each of said first to fourth switches comprises one of an n-channel transistor, a p-channel transistor and a combination thereof.

6. An amplifier according to claim 4, wherein said output circuit means comprises: a third set of at least two metal oxide semiconductor field effect transistors of one type which are connected such that a first transistor has a source connected to said positive power supply line, a gate connected to said capacitive means and to the gate of said first transistor of said first set through said third switch, and a drain connected to a source of a second transistor of said third set which has a gate directly connected to the gate of the second transistor of said first set and drain connected to said output terminal; and a fourth set of at least two metal oxide semiconductor field effect transistors of the other type which are connected such that a first transistor has a source connected to said negative power supply line a gate connected to said capacitive means and the gate of said first transistor of said second set through said fourth switch, and a drain connected to a source of a second transistor of said fourth set which has a gate directly connected to the gate of said second transistor of said second set and a drain connected to said output terminal.

7. An amplifier according to claim 3, wherein said switching means comprises first and second switching means, said first switching means comprising a first switch connected to the gate of said first transistor of said first set and operated in response to the first clock signal, a second switch connected to said first switch and the gate of said first transistor of said third set and operated in response to the second clock signal, a third switch connected to said inverting input terminal and operated in response to the second clock signal, a fourth switch connected to said third switch and said non-inverting input terminal and operated in response to the first clock signal, a fifth switch connected to the gate of said first transistor of said second set and operated in response to the first clock signal, and sixth switch connected to the gate of said first transistor of said fourth set, said second switching means comprising a seventh switch connected to the gate of said first transistor of said first set and operated in response to the second clock signal, an eighth switch connected to the gate of said first transistor of said third set and operated in response to the first clock signal, a ninth switch connected to said inverting input terminal and operated in response to the first clock signal, a tenth switch connected to said non-inverting input terminal and operated in response to the second clock signal, an eleventh switch connected to the gate of said first transistor of said second set and operated in response to the gate of said first transistor of said fourth set, and a twelfth switch connected to the gate of said first transistor of said fourth set and operated in response to the first clock signal; and said capacitive means comprises first and second capacitive means, said first capacitive means comprising a first capacitor connected to a node between said first and second switches and node between said third and fourth switches and a second capacitor connected to the node between said third and fourth switches and a node between said fifth and sixth switches, and said second capacitive means comprising a third capacitor connected to a node between said seventh and eight switches and node between said ninth and tenth switches and fourth capacitor connected to the node between said ninth and tenth switches and a node between said eleventh and twelfth switches, whereby said first capacitive means in cooperation with said first switching means applies the output control signals to the gates of said first transistors of said third and fourth sets during the second clock signal, and said second capacitive means in cooperation with said second switching means applies the output control signals to the gates of said first transistors of said third and fourth sets during the first clock signal.

8. An amplifier according to claim 7, wherein each of said first to twelfth switches comprises one of an n-channel transistor, a p-channel transistor, and a combination thereof.

9. An amplifier comprising:

first and second power supply terminals, one of which is at a higher potential than the other;

a first cascode connection of a plurality of p-channel transistors and a second cascode connection of a plurality of n-channel transistors, said first and second cascode connections being connected in series between said first and second power supply terminals;

an output terminal connected to a node between said first and second cascode connections;

first and second input terminals connected together through first and second switches being operative complementarily;

a first capacitor connected between the input of said first cascode connection and a common node between said first and second switches; and a second capacitor connected between the input of said second cascode connection and said common node.

* * * * *